(12) United States Patent
Shin et al.

(10) Patent No.: US 6,774,029 B2
(45) Date of Patent: Aug. 10, 2004

(54) METHOD FOR FORMING A CONDUCTIVE FILM AND A CONDUCTIVE PATTERN OF A SEMICONDUCTOR DEVICE

(75) Inventors: Ju-Cheol Shin, Seoul (KR);
Hyeon-Deok Lee, Seoul (KR);
Hong-mi Park, Yongin-si (KR); In-Sun Park, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/617,721

(22) Filed: Jul. 14, 2003

(65) Prior Publication Data

US 2004/0038530 A1 Feb. 26, 2004

(30) Foreign Application Priority Data

Aug. 23, 2002 (KR) ........................................ 2002-50198

(51) Int. Cl.[7] .......................................... H01L 21/4763
(52) U.S. Cl. ...................... 438/635; 438/648; 438/656; 438/658; 438/660; 438/685; 438/768; 438/785
(58) Field of Search ................................. 438/635, 648, 438/656, 658, 660, 685, 768, 785

(56) References Cited

U.S. PATENT DOCUMENTS 6,358,788 B1  3/2002  Chen et al. ................. 438/238
6,387,749 B1 * 5/2002  Lim ............................. 438/240
6,495,449 B1 * 12/2002 Nguyen ....................... 438/627
6,538,324 B1 * 3/2003  Tagami et al. .............. 257/751

FOREIGN PATENT DOCUMENTS

JP        11-54510      2/1999
JP        2000-22096    1/2000

* cited by examiner

*Primary Examiner*—Lynne Gurley
(74) *Attorney, Agent, or Firm*—Lee & Sterba, P.C.

(57) ABSTRACT

Disclosed are methods for forming a conductive film or a conductive pattern on a semiconductor substrate, including nitrifying a semiconductor substrate on which a tungsten film having a partially oxidized surface is formed to form a tungsten nitride film on the surface of the tungsten film, oxidizing the surface of the tungsten film having the tungsten nitride film to change the tungsten nitride film into a tungsten oxy-nitride film, and removing the tungsten oxy-nitride film and any residue generated by a reaction of tungsten from the surface of the tungsten film to form a tungsten film. Complete removal of residues generated by a reaction of tungsten from the surface of the tungsten film is made possible. Therefore, resistance of the tungsten film may be reduced, and failures generated by reacted residues formed on tungsten films may be prevented.

24 Claims, 19 Drawing Sheets

METHOD FOR FORMING A CONDUCTIVE FILM AND A CONDUCTIVE PATTERN OF A SEMICONDUCTOR DEVICE

BACKGROUND OF THE INVENTION

1. Field of the Invention

The present invention relates to a method for forming a conductive film and a conductive pattern of a semiconductor device. More particularly, the present invention relates to a method for forming a conductive film and a conductive pattern of a semiconductor device without a failure between conductive films or conductive patterns.

2. Description of the Related Art

Highly integrated semiconductor devices are required to stay in step with a rapidly developing information society. As a result, dimensions of electrical wirings of a semiconductor device are becoming more minute, and intervals between the electrical wirings are increasingly reduced. As the dimensions of the electrical wirings decrease, resistances in the conductive patterns or lines that function as the electrical wirings remarkably increase. Thus, the electrical wirings of the semiconductor device should be formed using materials having much lower resistances than those previously used.

In general, a conductive pattern primarily forms the semiconductor device. For example, a gate electrode or a bit line is formed using polysilicon or metal silicide having a relatively high resistance. Recently, the conductive pattern is formed using tungsten (W) because tungsten has a resistance lower than that of polysilicon or metal silicide and manufacturing processes for the semiconductor device are stably performed when tungsten is used.

FIGS. 1A and 1B illustrate cross-sectional views of a conventional method for forming a tungsten pattern of a semiconductor device.

Referring to FIG. 1A, a tungsten film is formed on a semiconductor substrate 10. Then, after a photoresist pattern 14 is formed on the tungsten film, the tungsten film is etched using the photoresist pattern 14 as an etching mask to from a tungsten pattern 12 on the semiconductor substrate 10.

Referring to FIG. 1B, the photoresist pattern 14 on the tungsten pattern 12 is removed. The photoresist pattern 14 may be removed through an ashing process and a stripping process. However, a side portion of the tungsten pattern 12 is partially or entirely oxidized during the ashing process because tungsten reacts rapidly with oxygen, thereby forming a tungsten oxide film 16 at the side portion of the tungsten pattern 12.

When a successive thermal process is performed concerning the tungsten pattern 12 having the tungsten oxide film 16 formed thereon, the tungsten oxide film 16 may abnormally grow from the side portion of the tungsten pattern 12 according to a reaction between the tungsten oxide film 16 and oxygen in the ambient atmosphere.

FIG. 2 illustrates a cross-sectional view showing a failure between tungsten patterns due to abnormally grown tungsten oxides.

As shown in FIG. 2, the abnormally grown tungsten oxide film 18 (called a "whisker") electrically connects one tungsten pattern 12 with an adjacent tungsten film, thereby generating a fatal failure between the tungsten patterns.

To overcome such a failure between the tungsten patterns, the prior art discloses a method of removing the tungsten oxide with a solution containing sulfuric acid or a mixture of sulfuric acid and hydrogen peroxide. However, the tungsten oxide may not be completely removed by those methods using the above-mentioned etching solutions.

SUMMARY OF THE INVENTION

In an effort to solve the problems mentioned above, it is a first feature of an embodiment of the present invention to provide a method of forming a conductive film without a failure between conductive films during a series of successive thermal processes.

It is a second feature of an embodiment of the present invention to provide a method of forming a conductive pattern without a failure between conductive patterns during a series of successive thermal processes.

In order to provide the first feature of an embodiment of the present invention, there is provided a method for forming a conductive film of a semiconductor device including i) nitrifying a semiconductor substrate on which a tungsten film having a partially oxidized surface is formed, to form a tungsten nitride film on the surface of the tungsten film, ii) oxidizing the surface of the tungsten film having the tungsten nitride film to change the tungsten nitride film into a tungsten oxy-nitride film; and iii) removing the tungsten oxy-nitride film and any residue generated by a reaction of tungsten from the surface of the tungsten film, to form a tungsten film.

In the method above, i) is preferably performed through a rapid thermal nitrification method or a plasma process using a gas including a nitrogen compound. If the plasma process is used, the plasma process is preferably performed at an energy of approximately 200 to 1000 W using at least one reaction gas selected from the group consisting of $NH_3$ gas, $NF_4$ gas and $N_2$ gas.

In the method above ii) is preferably performed through a rapid thermal oxidation process or a plasma process using an oxygen gas. In iii) of the method above, the tungsten oxy-nitride film is preferably removed using an etching solution for etching oxide. Preferably, the etching solution includes hydrofluoric acid or a mixture of hydrofluoric acid and hydrogen peroxide.

To provide the second feature of an embodiment of the present invention, there is provided a method for forming a conductive pattern of a semiconductor device including i) forming a conductive film mainly composed of tungsten on a semiconductor substrate; ii) forming a photoresist pattern on the conductive film; iii) forming a conductive pattern by etching the conductive film using the photoresist pattern as an etching mask; iv) removing the photoresist pattern while a surface of the conductive pattern is partially oxidized; v) nitrifying the conductive pattern including the partially oxidized surface to change the tungsten in the surface of the conductive pattern into a tungsten nitride film; vi) oxidizing the conductive pattern including the tungsten nitride film formed thereon to change the tungsten nitride film formed on the surface of the conductive pattern into a tungsten oxy-nitride film; and vii) forming a conductive pattern without an oxide on the conductive pattern by removing the tungsten oxy-nitride film.

In the method above, vi) is preferably performed by a rapid thermal oxidation process or a plasma process using an oxygen gas.

To provide the second feature according to another embodiment of the present invention, there is provided a method for forming a conductive pattern of a semiconductor device including i) forming a conductive film mainly composed of tungsten on a semiconductor substrate; ii) forming a photoresist pattern on the conductive film; iii) forming a conductive pattern on which the photoresist pattern is formed by etching the conductive film using the photoresist pattern as an etching mask; iv) nitrifying the conductive pattern to change the tungsten in a side portion of the conductive pattern into a tungsten nitride film; v) removing the photoresist pattern using a gas including oxygen, and simultaneously changing the tungsten nitride film into a tungsten oxy-nitride film; and vi) forming a conductive pattern without an oxide on the conductive pattern by removing the tungsten oxy-nitride film.

In the method above, v) is preferably performed by a plasma process using an oxygen gas.

In the two most recent methods above, the conductive film preferably includes a tungsten film and a tungsten suicide film; nitrifying the conductive pattern is preferably performed by a rapid thermal nitrification process or a plasma process using a gas including a nitrogen compound. If the plasma process is used to nitrify the conductive pattern in the methods above, the plasma process is preferably performed at an energy of approximately 200 to 1000 W using at least one reaction gas selected from the group consisting of $NH_3$ gas, $NF_4$ gas and plasma $N_2$ gas. Also, in the two most recent methods above, the tungsten oxy-nitride film is preferably removed using an etching solution for etching oxide, the etching solution preferably including hydrofluoric acid or a mixture of hydrofluoric acid and hydrogen peroxide. In addition, (i) in the two most recent methods preferably further includes forming a silicon nitride film on the conductive film. Nitride spacers may also be formed at side portions of the conductive pattern after forming the respective conductive pattern in the methods above.

According to the present invention, tungsten oxide is completely removed from a conductive film and a conductive pattern. Hence, a resistance augmentation of the conductive film or the conductive pattern due to the tungsten oxide may be prevented. Also, a failure generated between conductive films or conductive patterns may be prevented because an abnormal growth of the tungsten oxide from the conductive film or the conductive pattern is prevented.

BRIEF DESCRIPTION OF THE DRAWINGS

The above features and advantages of the present invention will become more apparent to those of ordinary skill in the art by describing in detail preferred embodiments thereof with reference to the attached drawings in which.

DESCRIPTION OF THE PREFERRED EMBODIMENTS

Figure 1A:
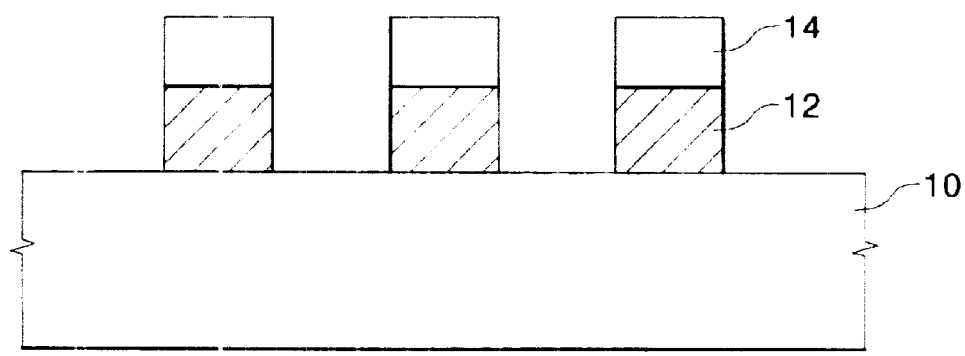
FIGS. 1A and 1B illustrate cross-sectional views of a conventional method for forming a tungsten pattern.
Figure 1B:
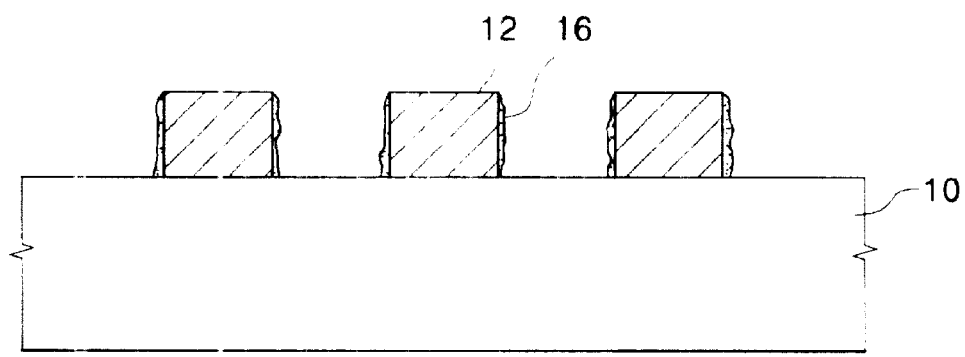
Figure 2:
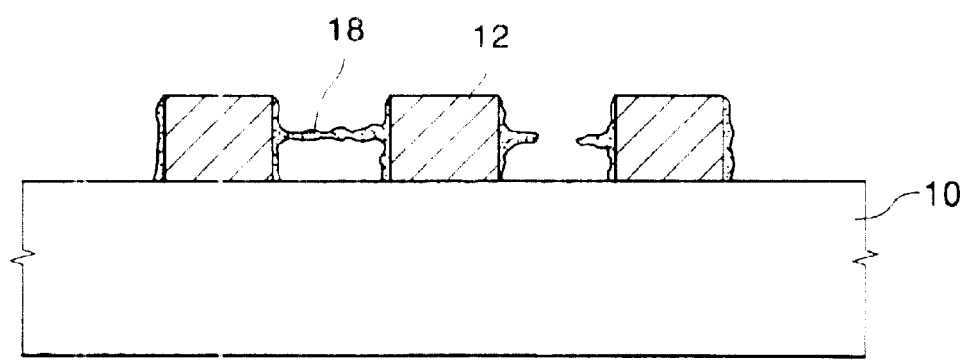
FIG. 2 illustrates a cross-sectional view showing a failure between tungsten patterns due to abnormally grown tungsten oxides.

Korean Patent Application No. 2002-50198, filed on Aug. 23, 2002, and entitled: "Method For Forming a Conductive Film and a Conductive Pattern of a Semiconductor Device," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Embodiment 1

FIGS. 3A to 3D illustrate cross-sectional views for showing a method for forming a conductive film according to a first embodiment of the present invention.

Figure 3A:
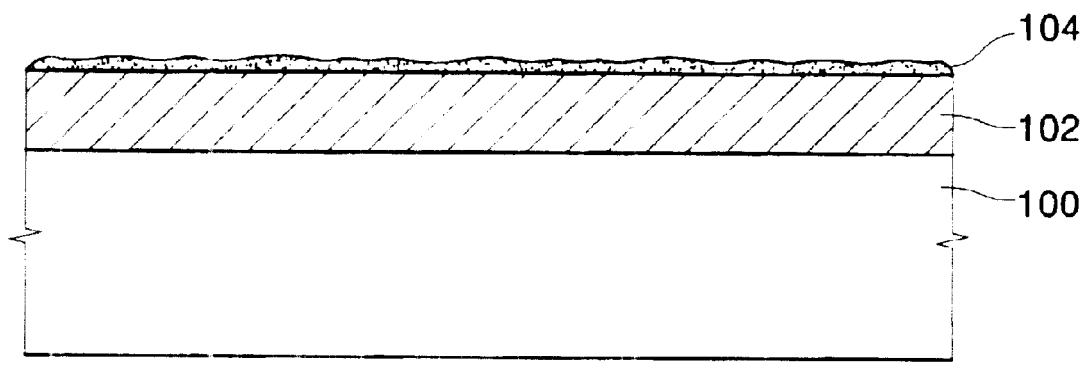
FIGS. 3A to 3D illustrate cross-sectional views for showing a method for forming a conductive film according to a first embodiment of the present invention.

Referring to FIG. 3A, a tungsten (W) film 102 is formed on a semiconductor substrate 100. In this case, a tungsten oxide film 104 is entirely or partially formed on a surface of the semiconductor substrate 100 when the tungsten reacts with oxygen during formation of the tungsten film 102.

Figure 3B:
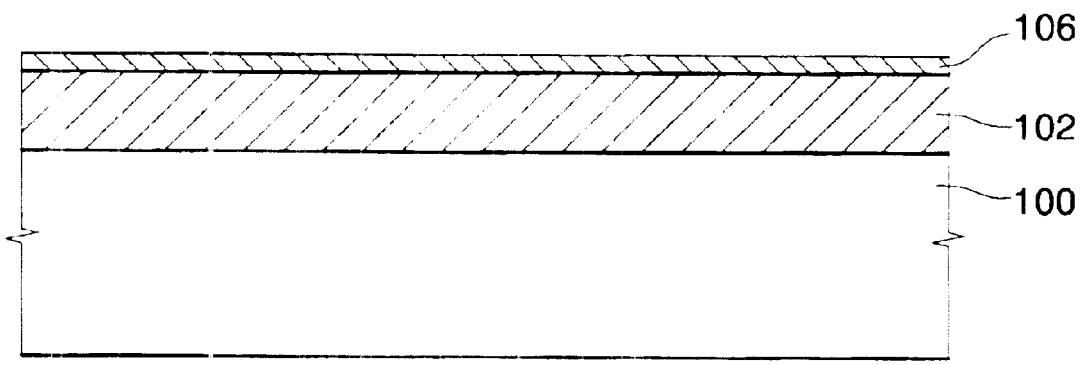

Referring to FIG. 3B, the tungsten film 102 having the tungsten oxide film 104 formed thereon is nitrified so that a surface of the tungsten film 102 is converted into a tungsten nitride ($WN_x$) film 106. Nitrification of the tungsten film 102 is preferably accomplished in a gas including a nitrogen compound by either a rapid thermal nitrification (RTN) process or a plasma process. More particularly, when the tungsten film 102 is nitrified by the RTN process, the RTN process is performed using $NH_3$, $NF_1$ $N_2$ etc., or a combination thereof, for approximately 20 to 200 seconds at a temperature of approximately 500 to 800° C. under a pressure of approximately 1 to 2 Torr. When the tungsten film 102 is nitrified by the plasma process, a nitrogen containing gas such as $NH_3$, $NF_1$ $N_2$ etc., or a combination thereof, is used with an energy of approximately 200 to 1000 W. The nitrification process for the tungsten film 102, however, may be varied according to a thickness of the tungsten oxide formed on the tungsten film 102 and a final remaining thickness of the tungsten film 102 when the nitrification process is completed.

Figure 3C:
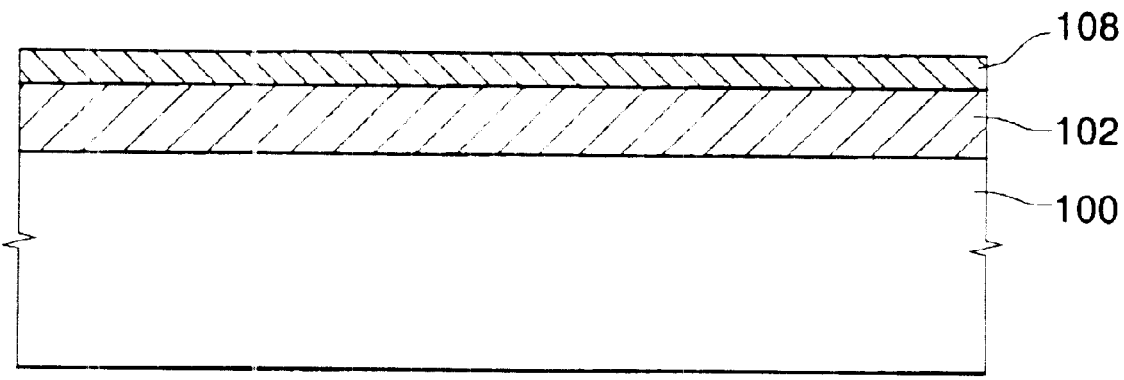

Referring to FIG. 3C, the tungsten film 102 having the tungsten nitride film 106 (FIG. 3B) formed thereon is oxidized so that the tungsten nitride film 106 is changed into a tungsten oxy-nitride ($WO_xN_y$) film 108. The tungsten nitride film 106 may be oxidized by means of a general rapid thermal oxidation (RTO) process or a plasma process. In the oxidation process, nitrogen atoms in the tungsten nitride film 106 are diffused into the tungsten film 102, thereby forming the tungsten oxy-nitride film 108 to a predetermined thickness on the surface of the tungsten film 102.

Figure 4:
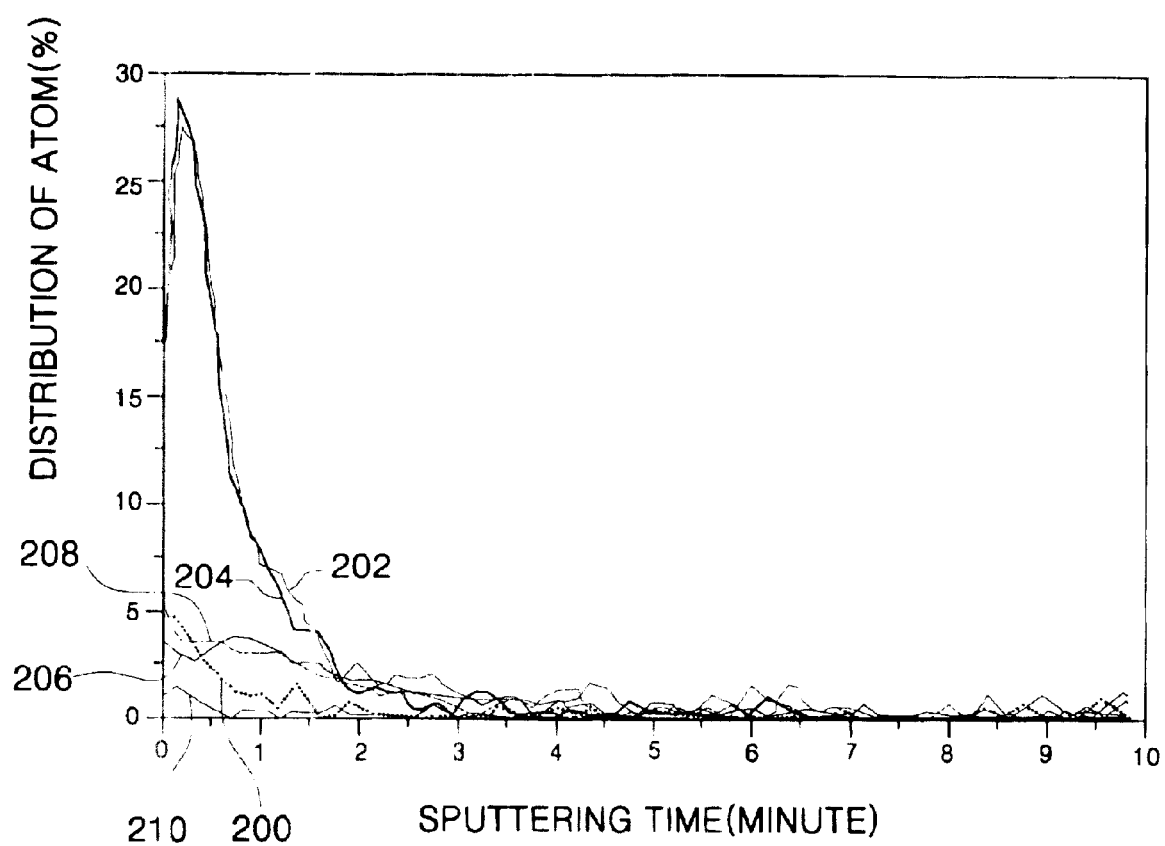
FIG. 4 is a graph showing diffusions of nitrogen atoms into tungsten films during oxidation processes.

FIG. 4 is a graph showing the diffusion of nitrogen atoms into tungsten films during oxidation processes.

With respect to FIG. 4, after tungsten films were formed on several substrates and nitrification and oxygen plasma ashing processes were performed with respect to the substrates, distributions of nitrogen atoms from surfaces of films formed on the tungsten films were measured. Also, element analyses of the films were performed using an Auger Electron Spectroscopy (AES) that analyzes elements in a target material by detecting Auger electrons emitted from the target material when electron beams are applied to a surface of the target material.

In FIG. 4, a graph 200 denotes a distribution of nitrogen atoms in a tungsten film after deposition of the tungsten film. Graphs 202 and 204 represent distributions of nitrogen atoms after performance of plasma processes on tungsten films using reaction gases containing $NH_3$ at energies of about 300 W and about 400 W, respectively. Graphs 206 and 208 represent distributions of nitrogen atoms after performance of plasma processes on tungsten films using reaction gases containing $NH_3$ at energies of about 300 W and about 400 W, respectively, and performance of ashing processes on the tungsten films using oxygen plasmas. Graph 210 represents a distribution of nitrogen atoms after an ashing process was performed on a deposited tungsten film using oxygen plasma without the plasma process.

As illustrated in graph 200, after initial tungsten film deposition, the nitrogen atoms are distributed near the surface of the tungsten film with minute quantity. However, after the plasma processes are respectively performed on the tungsten films using reaction gases containing $NH_3$ at energies of about 300 W and about 400 W, respectively, nitrogen atoms are shown to be concentrated near the surface of the tungsten film, as illustrated in graphs 202 and 204. Then, after the performance of plasma processes on the tungsten films using reaction gases containing $NH_3$ at energies of about 300 W and about 400 W, and after the ashing processes are performed on the tungsten films using oxygen plasma, nitrogen atoms are shown to be distributed from the surface of the tungsten film to predetermined depths of the tungsten film, as illustrated in graphs 206 and 208. Furthermore, when the ashing process is performed for a tungsten film using oxygen plasma without the plasma process using the reaction gas containing $NH_3$ for nitrification of the tungsten film, nitrogen atoms are hardly distributed in the tungsten film, as illustrated in graph 210.

Referring to FIG. 4, when a nitrification process is performed with respect to the tungsten film, nitrogen atoms are concentrated near the surface of the tungsten film (see graphs 202 and 204), and then a tungsten oxy-nitride film having a predetermined depth is formed from the surface of the tungsten film according to the diffusion of nitrogen atoms into the tungsten film during the ashing process involving oxygen (see graphs 206 and 208).

Figure 3D:
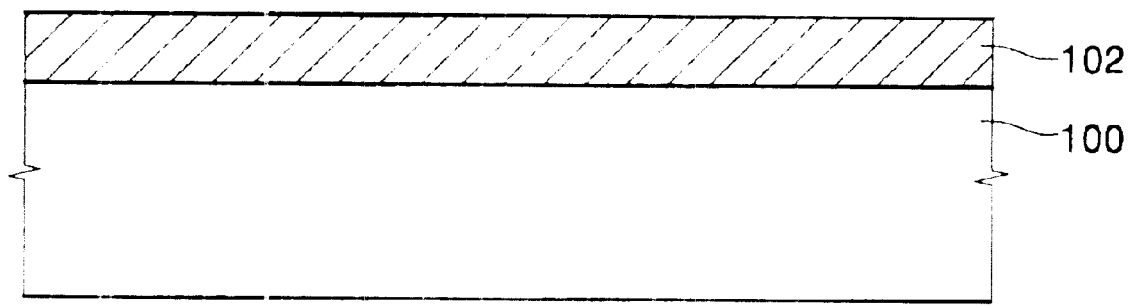

Referring to FIG. 3D, the tungsten oxy-nitride film 108 formed on the tungsten film 102 is removed using an etching solution. An etching solution capable of etching silicon oxide may be used to remove the tungsten oxy-nitride film 108. For example, the etching solution used to remove the tungsten oxy-nitride film 108 may contain hydrofluoric acid, or a mixture of hydrofluoric acid and hydrogen peroxide.

Transmission electron microscope (TEM) analysis of a tungsten oxy-nitride film and a tungsten oxide film has revealed that the tungsten oxy-nitride film has more pores than the tungsten oxide film. Hence, the above-mentioned etching solution can scarcely etch the tungsten oxide film, while the etching solution can easily remove the tungsten oxy-nitride film because chemical bonds between the atoms in the tungsten oxy-nitride film are unstable. In addition, the tungsten film under the tungsten oxy-nitride film is barely etched when the above-mentioned etching solution is used. Thus, undesirable films formed on the tungsten film can be removed without damaging the tungsten film.

Embodiment 2

FIGS. 5A to 5G illustrate cross-sectional views for showing a method for forming a gate electrode of a semiconductor device according to a second embodiment of the present invention.

Figure 5A:
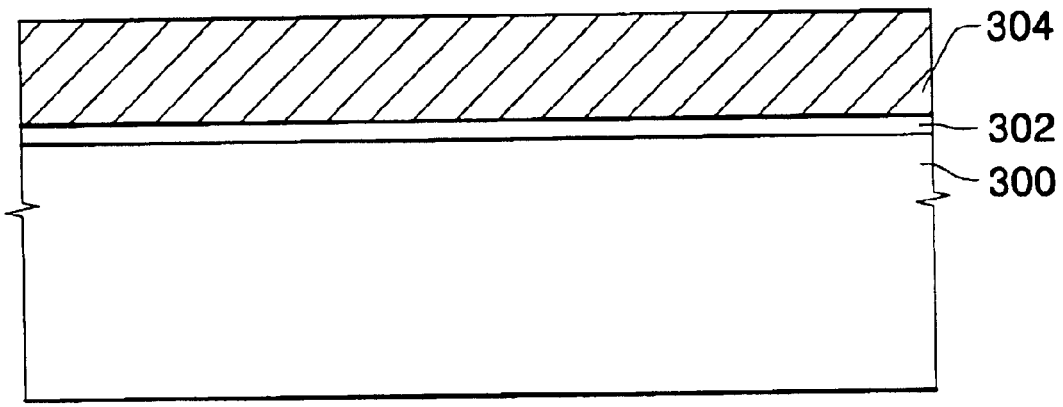
FIGS. 5A to 5G illustrate cross-sectional views for showing a method for forming a gate electrode of a semiconductor device according to a second embodiment of the present invention.

Referring to FIG. 5A, there are successively formed a gate oxide film 302 and a conductive film 304 on a semiconductor substrate 300. The conductive film is preferably mainly comprised of tungsten and includes a tungsten film and a tungsten silicide film. However, for simplicity, the conductive film will hereinafter be described as being comprised of a tungsten film only, i.e., a tungsten film 304.

The tungsten film 304 may be formed by sputtering or chemical vapor deposition. Also, although it is not shown, a polysilicon film may be formed between the gate oxide film 302 and the tungsten film 304.

Figure 5B:
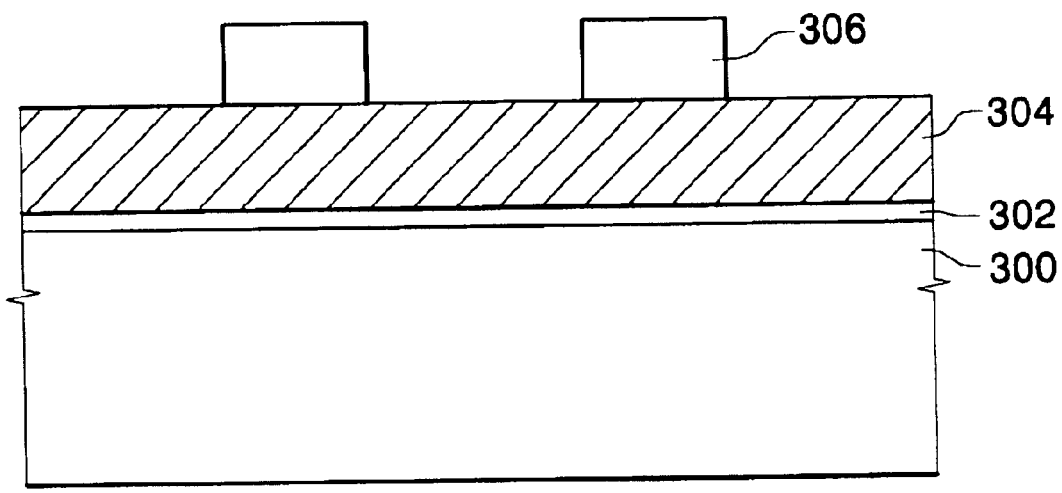

Referring to FIG. 5B, a photoresist pattern 306 is formed on the tungsten film 304. Particularly, the photoresist pattern 306 is formed by an exposure process and a developing process after coating a photoresist on the tungsten film 304 and masking portions of the photoresist for forming a gate electrode.

Figure 5C:
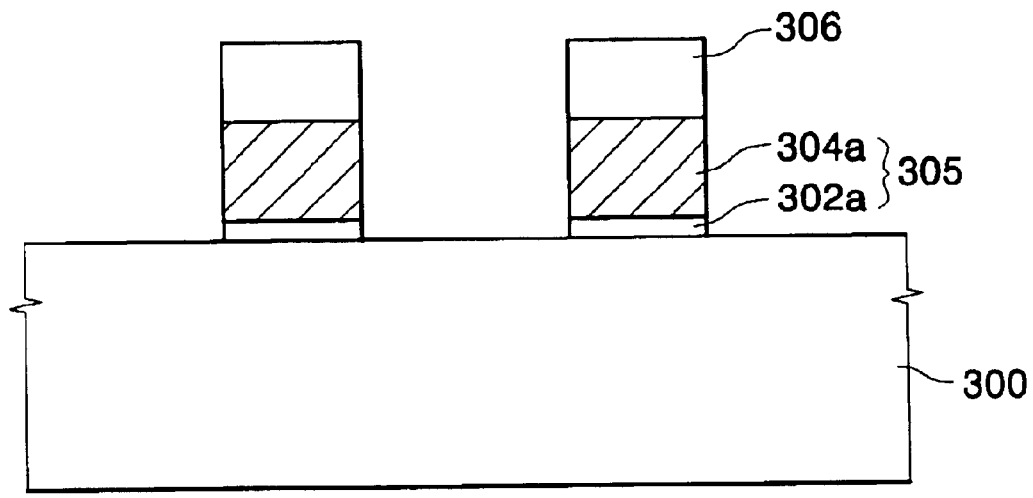

Referring to FIG. 5C, the tungsten film 304 and the gate oxide film 302 are successively etched using the photoresist pattern 306 as an etching mask, thereby forming a gate structure 305 having a gate oxide pattern 302a and a tungsten film pattern 304a.

Figure 5D:
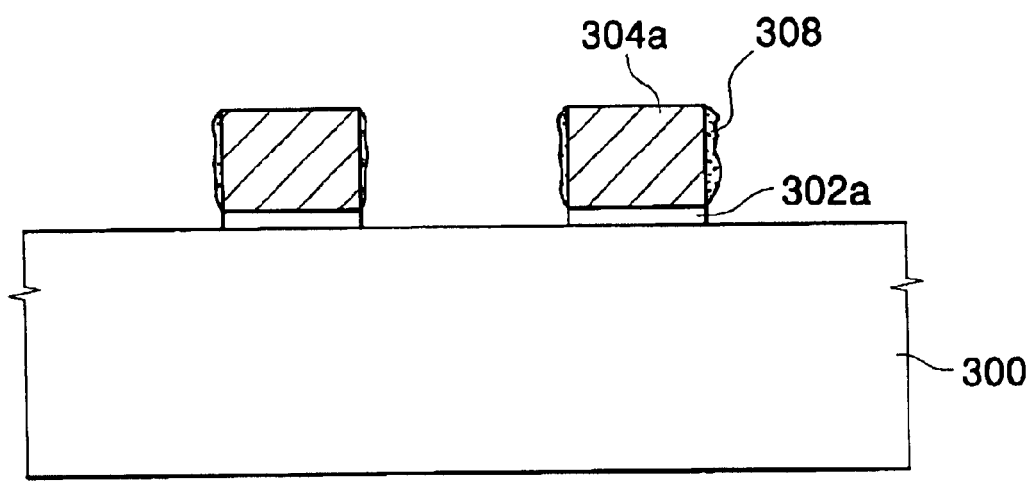

Referring to FIG. 5D, the photoresist pattern 306 on the tungsten film pattern 304a is completely removed. A process for removing the photoresist pattern 306 will be described as follows.

At first, the semiconductor substrate 300 having the photoresist pattern 306 formed thereon is pre-baked at a temperature of approximately 250° C. Then, the photoresist pattern 306 is removed through a chemical ashing process performed with oxygen plasma. In this case, the ashing process may be repeatedly performed, two or more times, when necessary.

Subsequently, a photoresist stripping process is additionally performed using an etching gas such as chlorine (Cl) or fluorine (F), or using an etching solution such as sulfuric acid ($H_2SO_4$). Thus, residue of the photoresist pattern 306 is completely removed by the additional stripping process.

In the mean time, side portions of the tungsten film pattern 304a are exposed when the photoresist pattern 306 is removed. Thus, the exposed portions of the tungsten film pattern 304a are easily reacted with oxygen during the removal of the photoresist pattern 306, thereby forming undesired tungsten oxide 308 on a surface of the tungsten film pattern 304a. That is, the tungsten oxide 308 is formed on the side portions or an entire surface of the tungsten film pattern 304a when the photoresist pattern 306 is removed.

Figure 5E:
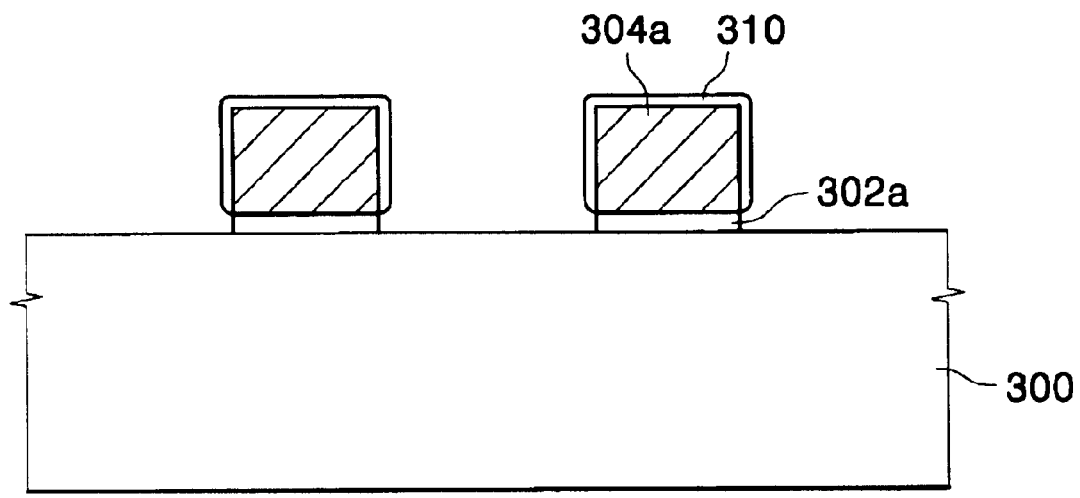

Referring to FIG. 5E, the semiconductor substrate 300 having formed thereon the tungsten film pattern 304a, which is where the tungsten oxide 308 (of FIG. 5D) is formed, is nitrified so that the surface of the tungsten film pattern 304a is changed into a tungsten nitride film 310. The semiconductor substrate 300 can be nitrified through a RTN process or a plasma process using a nitrogen compound. In particular, when the tungsten film pattern 304a is nitrified by the RTN process, the RTN process may be performed using $NH_3$, NF or $N_2$ at a temperature of approximately 500 to 800° C. for about 20 to 200 seconds under a pressure of approximately 1 to 2 Torr. The $NH_3$, NF or $N_2$ gases may be used alone or in a mixture thereof. When the tungsten film pattern 304a is nitrified by the plasma process, the plasma process may be performed at an energy of approximately 200 to 1000 W by using $NH_3$, NF or $N_2$. These gases may be used alone or in a mixture. However, the process for nitrifying the tungsten film pattern 304a may be varied according to a thickness of the tungsten oxide 308 (FIG. 5D) previously formed on the tungsten film pattern 304a, and a thickness of the tungsten film pattern 304a that will have to remain when the process for nitrifying the tungsten film pattern 304a is completed.

Figure 5F:
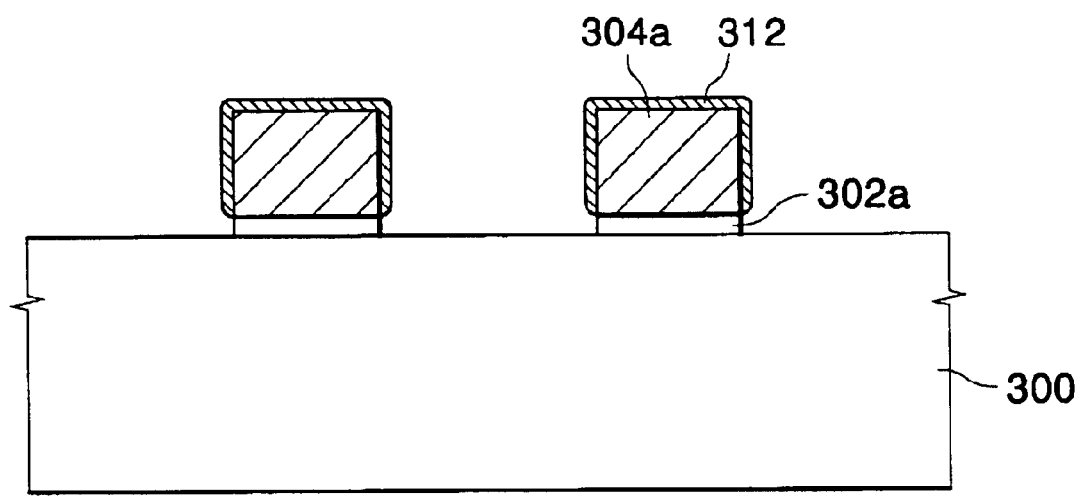

Referring to FIG. 5F, the semiconductor substrate 300 having formed thereon the tungsten film pattern 304a where the tungsten nitride film 310 is formed is oxidized to form a tungsten oxy-nitride film 312 ($WO_xN_y$) having a predetermined depth from the surface of the tungsten film pattern 304a. The tungsten oxy-nitride film 312 may be formed by a RTO process or an oxygen plasma process.

Figure 5G:
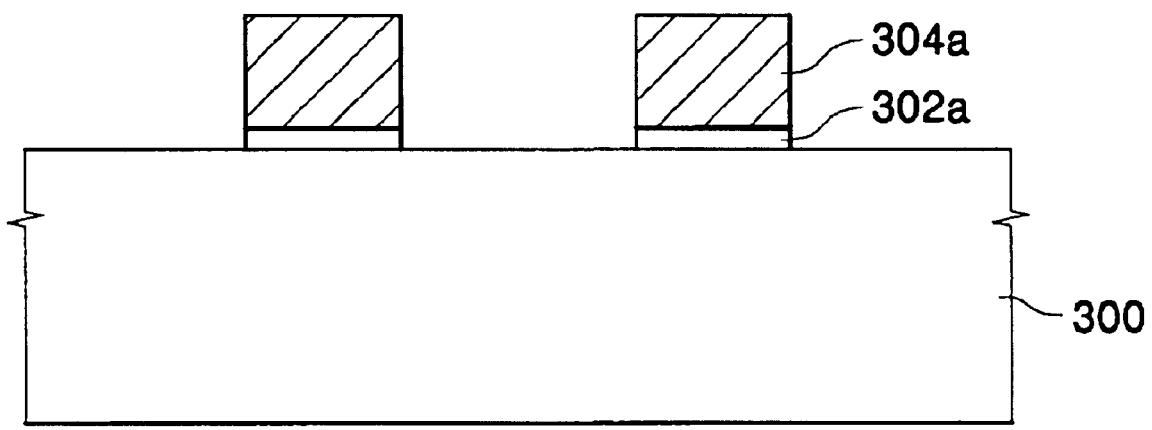

Referring to FIG. 5G, the tungsten oxy-nitride film 312 formed from the surface of the tungsten film pattern 304a is removed with an etching solution. In this case, the tungsten oxy-nitride film 312 may be removed using an etching solution capable of etching silicon oxide. For example, the tungsten oxy-nitride film 312 may be etched using an etching solution containing hydrofluoric acid, or an etching solution containing hydrofluoric acid mixed with hydrogen peroxide. When such an etching solution is used for etching the tungsten oxy-nitride film 312, undesired films can be easily removed from the tungsten film pattern 304a under the tungsten oxy-nitride film 312 without etching the tungsten film pattern 304a. Therefore, fabrication of a gate electrode comprising tungsten and having no undesired films formed thereon is made possible by the above-described processes.

Embodiment 3

FIGS. 6A to 6G illustrate cross-sectional views for showing a method for forming a conductive structure of a semiconductor device according to a third embodiment of the present invention.

The conductive structure of the present embodiment includes a word line and a bit line of the semiconductor device. In the present embodiment, the method for forming the conductive structure is identical to that of the second embodiment except that a silicon nitride film is formed on the conductive structure in the present embodiment.

Figure 6A:
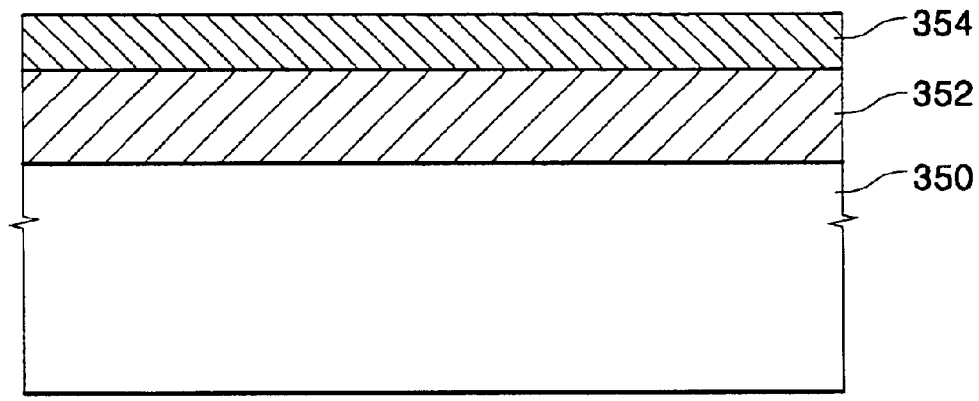
FIGS. 6A to 6G illustrate cross-sectional views for showing a method for forming a conductive structure of a semiconductor device according to a third embodiment of the present invention.

Referring to FIG. 6A, a conductive film 352 mainly comprising tungsten and a silicon nitride film 354 are successively formed on a semiconductor substrate 350. Here, semiconductor devices may be formed on the semiconductor substrate 350. The conductive film 352 includes a tungsten film and a tungsten silicide film.

The conductive film 352 is formed through a sputtering process or a chemical vapor deposition process. In this case, the silicon nitride film 354 is formed on the tungsten film 352 after the tungsten film 352 is nitrified and oxidized by the nitrification and oxidation processes as described in Embodiment 1.

Figure 6B:
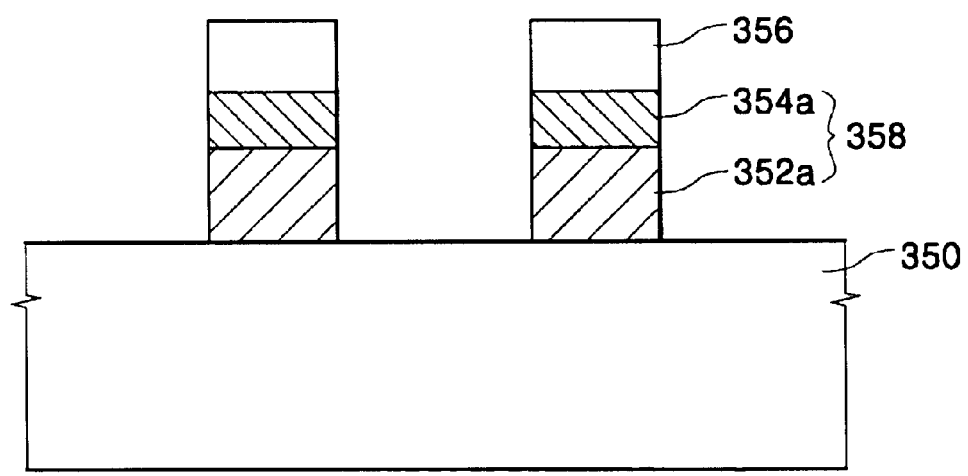

Referring to FIG. 6B, a photoresist pattern 356 is formed on the silicon nitride film 354 for selectively masking the silicon nitride film 354 and the tungsten film 352 (of FIG. 6A) in order to form a conductive film pattern. Then, the silicon nitride film 354 and the tungsten film 352 are successively etched using the photoresist pattern 356 as an etching mask, thereby forming a structure 358 including a tungsten film pattern 352a and a silicon nitride film pattern 354a.

Figure 6C:
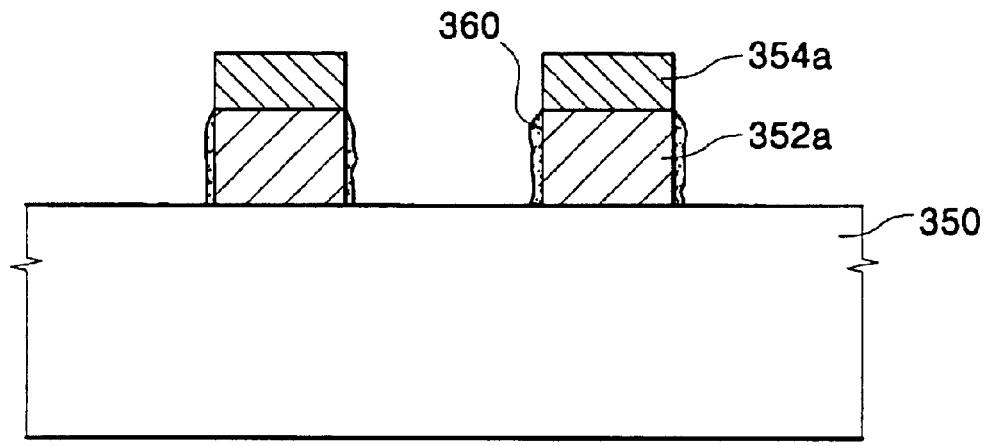

Referring to FIG. 6C, the photoresist pattern 356 (FIG. 6B) on the silicon nitride film pattern 354a is removed. Meanwhile, during removal of the photoresist pattern 356, the tungsten of the tungsten film pattern 352a can easily react with oxygen resulting in an undesired tungsten oxide 360 being formed on the tungsten film pattern 352a. That is, the undesired tungsten oxide 360 is formed on side portions or an entire surface of the tungsten film pattern 352a during the process for removing the photoresist pattern 356.

Figure 6D:
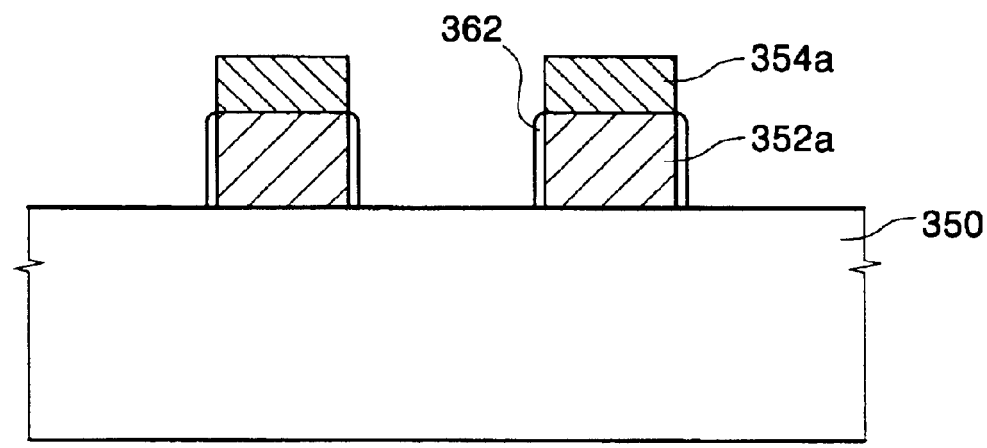

Referring to FIG. 6D, the semiconductor substrate 350 including the tungsten film pattern 352a where the tungsten oxide 360 is formed is nitrified to change the surface of the tungsten film pattern 352a into a tungsten nitride film 362. The tungsten nitride film 362 may be formed through a RTN process or a plasma process using a gas containing a nitrogen compound.

Figure 6E:
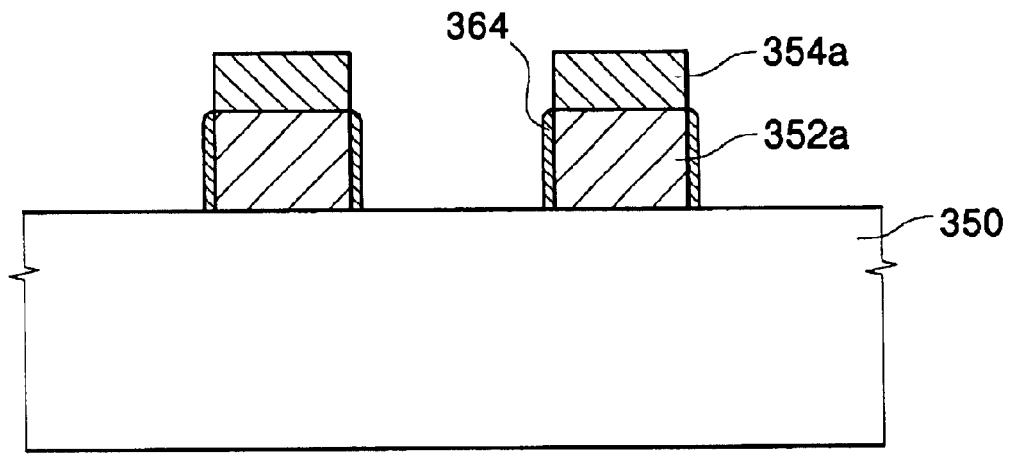

Referring to FIG. 6E, the semiconductor substrate 350 including the tungsten film pattern 352a where the tungsten nitride 362 is formed is oxidized so that a tungsten oxy-nitride film ($WO_xN_y$) 364 is formed at side portions of the tungsten film pattern 352a to a predetermined depth. The tungsten oxy-nitride film 364 may be formed by a RTO process or a plasma process.

Figure 6F:
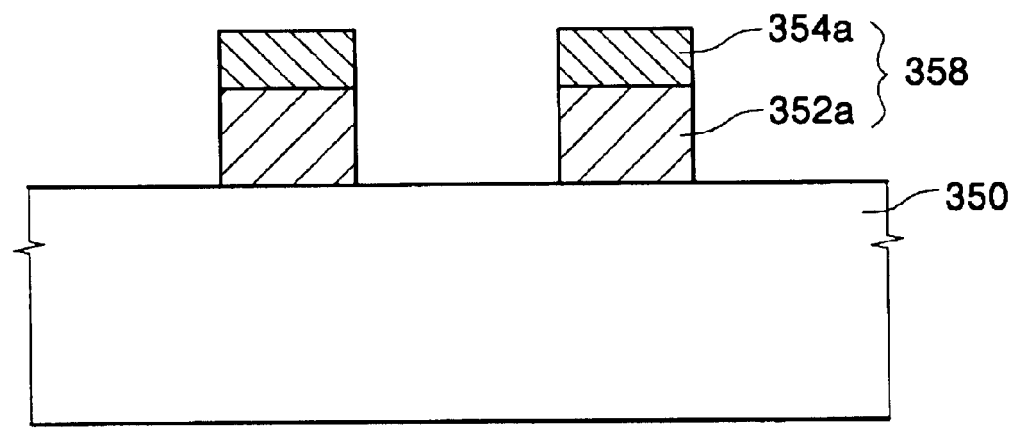

Referring to FIG. 6F, the tungsten oxy-nitride film 364 having the predetermined depth from the surface of the tungsten film pattern 352a is removed using an etching solution that can etch silicon oxide. When such an etching solution is used for etching the tungsten oxy-nitride film 364, undesired films formed on the tungsten film pattern 352a can be easily removed without etching the tungsten film pattern 352a.

Figure 6G:
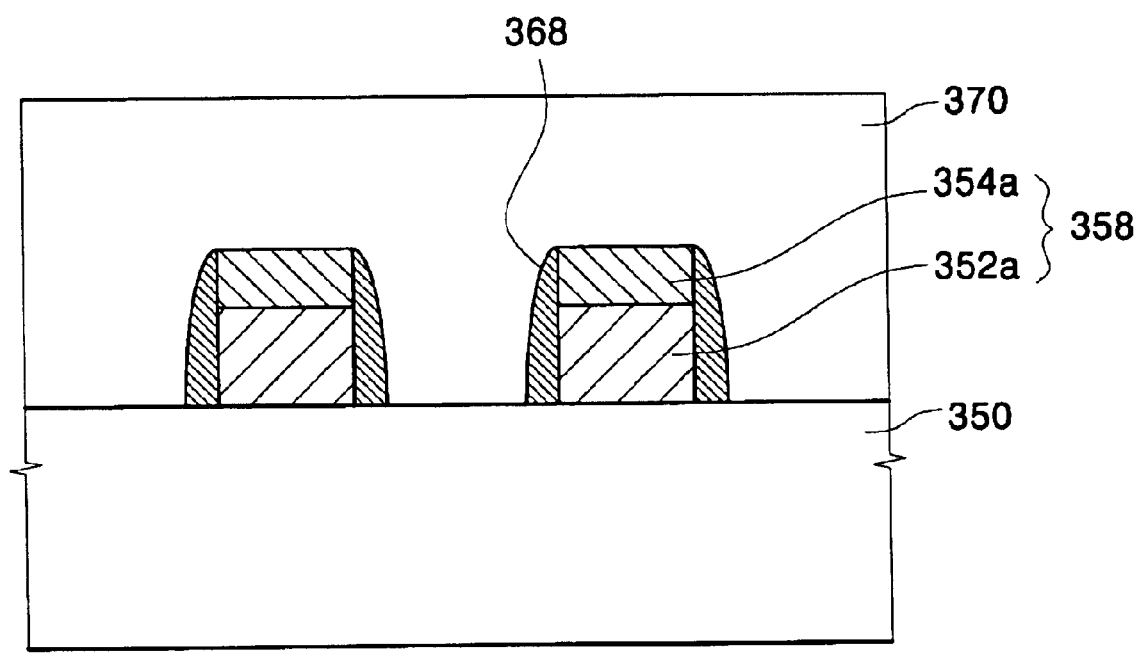

Referring to FIG. 6G, nitride spacers 368 are formed on side portions of the structure 358 including the tungsten film pattern 352a formed in accordance with the above-described processes. Then, an interlayer dielectric 370 is formed to completely cover the structure 358 including the nitride spacers 368. The nitride spacers 368 and the nitride film pattern 354a function as a passivation film for the tungsten film pattern 352a in order to prevent oxidation of the tungsten film pattern 352a when the interlayer dielectric 370 is formed.

Embodiment 4

FIGS. 7A to 7E illustrate cross-sectional views for showing a method for forming a conductive pattern of a semiconductor device according to a fourth embodiment of the present invention.

The conductive pattern of the present embodiment includes a word line and a bit line of the semiconductor device.

Figure 7A:
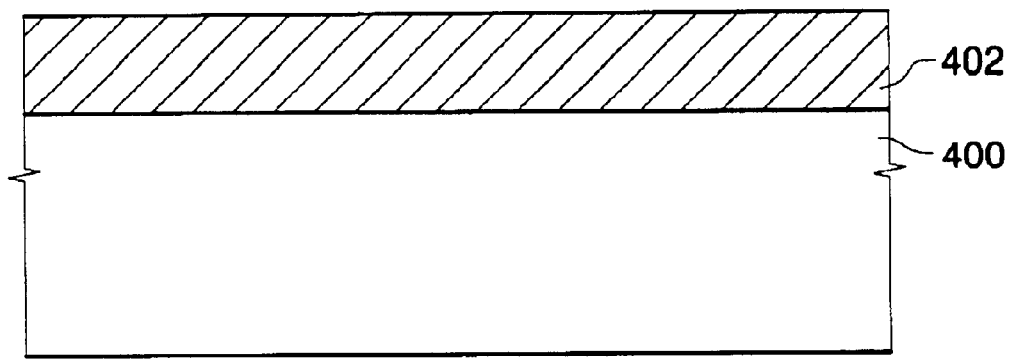
FIGS. 7A to 7E illustrate cross-sectional views for showing a method for forming a conductive pattern of a semiconductor device according to a fourth embodiment of the present invention.

Referring to FIG. 7A, a conductive film mainly composed of tungsten is formed on a semiconductor substrate 400. Semiconductor devices may be formed between the semiconductor substrate 400 and the conductive film. The conductive film includes a tungsten film and a tungsten suicide film.

Hereinafter, the conductive film will be described as the tungsten film 402 since the conductive film is mainly composed of tungsten.

The tungsten film 402 may be formed through a sputtering process or a chemical vapor deposition process. In addition, the tungsten film 402 may be nitrified, oxidized and rinsed by the nitrification and oxidation processes described in Embodiment 1.

Figure 7B:
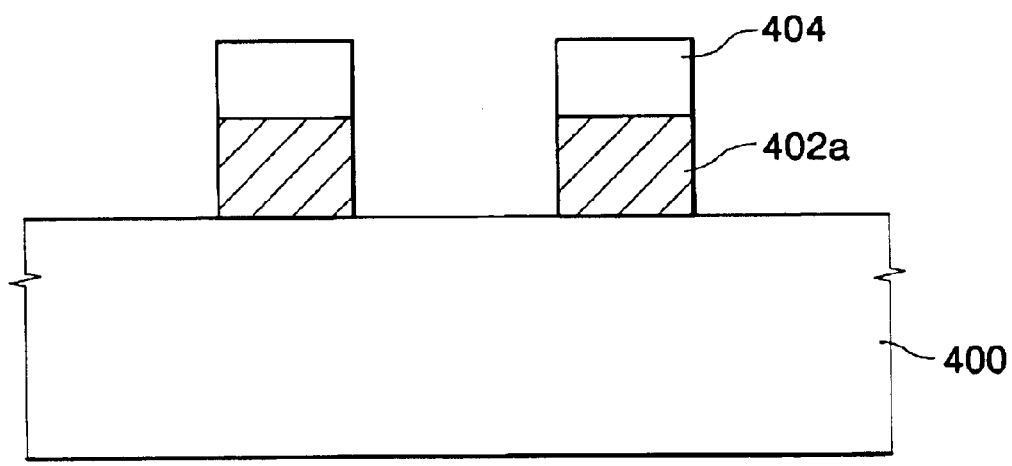

Referring to FIG. 7B, a photoresist pattern 404 is formed on the tungsten film 402 for selective masking the tungsten film 402 in order to form a conductive pattern. Then, the tungsten film 402 is etched using the photoresist pattern 404 as an etching mask. Hence, a tungsten film pattern 402a is formed on which the photoresist pattern 404 is positioned.

Figure 7C:
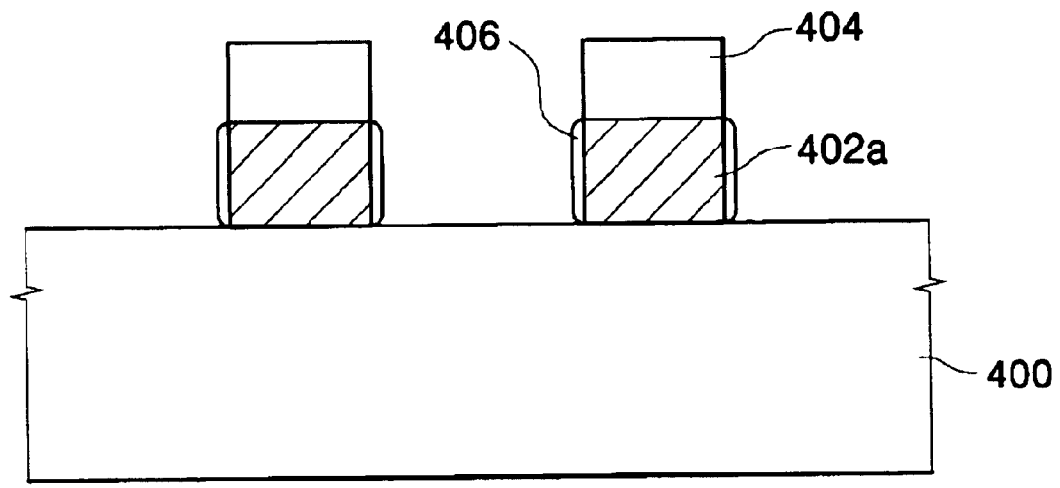

Referring to FIG. 7C, the tungsten film pattern 402a that is exposed and located beneath the photoresist pattern 404 is nitrified to form a tungsten nitride film 406 from side portions of the tungsten film pattern 402a to a predetermined depth. The tungsten nitride film 406 may be formed through a RTN process or a plasma process using a gas containing a nitrogen compound.

Figure 7D:
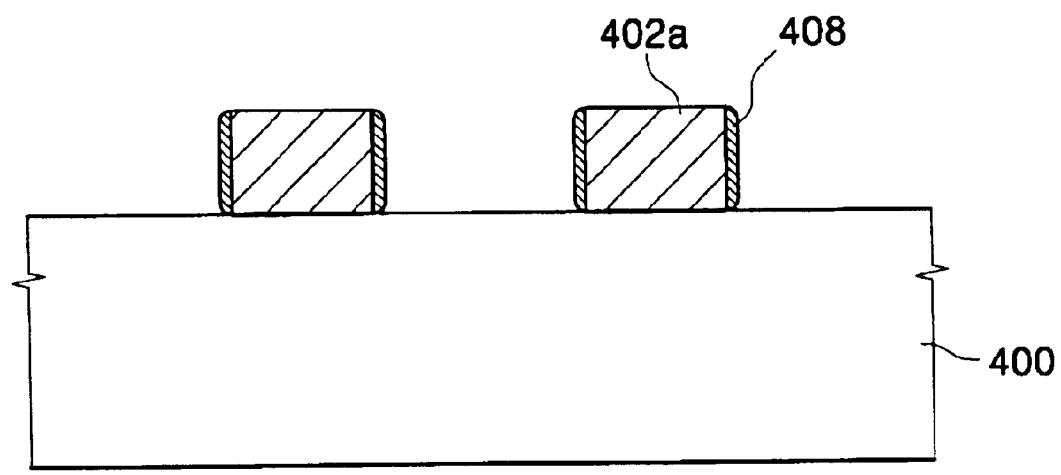

Referring to FIG. 7D, the photoresist pattern 404 on the tungsten film pattern 402a is removed using a gas including oxygen. The tungsten nitride film 406 formed at side portions of the tungsten film pattern 402a is reacted with the oxygen, thereby forming a tungsten oxy-nitride film 408 at side portions of the tungsten film pattern 402a. A plasma ashing process using oxygen ($O_2$) or ozone ($O_3$) may used to remove the photoresist pattern 404 and to form the tungsten oxy-nitride film 408.

Figure 7E:
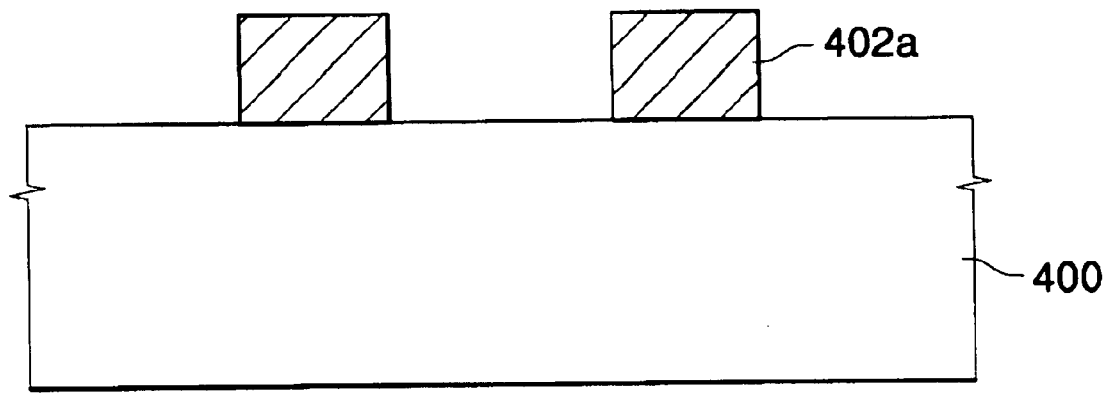

Referring to FIG. 7E, the tungsten oxy-nitride film 408 having the predetermined depth from the surface of the tungsten film pattern 402a is removed with an etching solution that can etch silicon oxide. When such an etching solution is used for etching the tungsten oxy-nitride film 408, undesired films on the surface of the tungsten film pattern 402a can be removed without etching the tungsten film pattern 402a.

According to the present embodiment, the method for forming the conductive pattern is simplified because the process for removing the photoresist pattern and the process for oxidizing the tungsten film pattern are simultaneously performed.

Embodiment 5

FIGS. 8A to 8F illustrate cross-sectional views for showing a method for forming a conductive structure of a semiconductor device according to a fifth embodiment of the present invention.

The conductive structure of the present embodiment includes a word line and a bit line of the semiconductor device. In the present embodiment, the method for forming the conductive structure is identical to that of the fourth embodiment except that a silicon nitride film is formed on the conductive structure in the present embodiment.

Figure 8A:
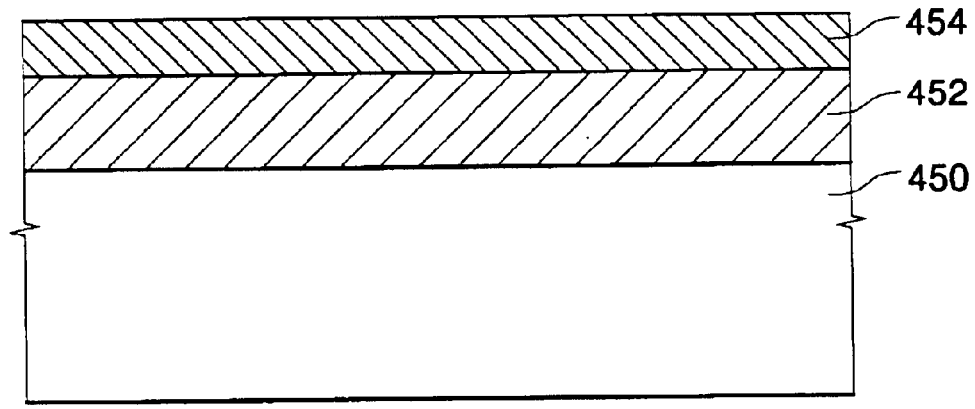
FIGS. 8A to 8F illustrate cross-sectional views for showing a method for forming a conductive structure of a semiconductor device according to a fifth embodiment of the present invention.

Referring to FIG. 8A, a conductive film containing mainly tungsten, and a silicon nitride film 454, are successively formed on a semiconductor substrate 450. Here, semiconductor devices may be formed on the semiconductor substrate 450. The conductive film includes a tungsten film and a tungsten silicide film. Hereinafter, the conductive film will be described as a tungsten film 452, as the conductive film is mainly comprised of tungsten.

The tungsten film 452 is formed through a sputtering process or a chemical vapor deposition process. In this case, the silicon nitride film 454 can be formed on the tungsten film 452 after the tungsten film 452 is nitrified, oxidized and rinsed through the nitrification and oxidation processes described in Embodiment 1.

Figure 8B:
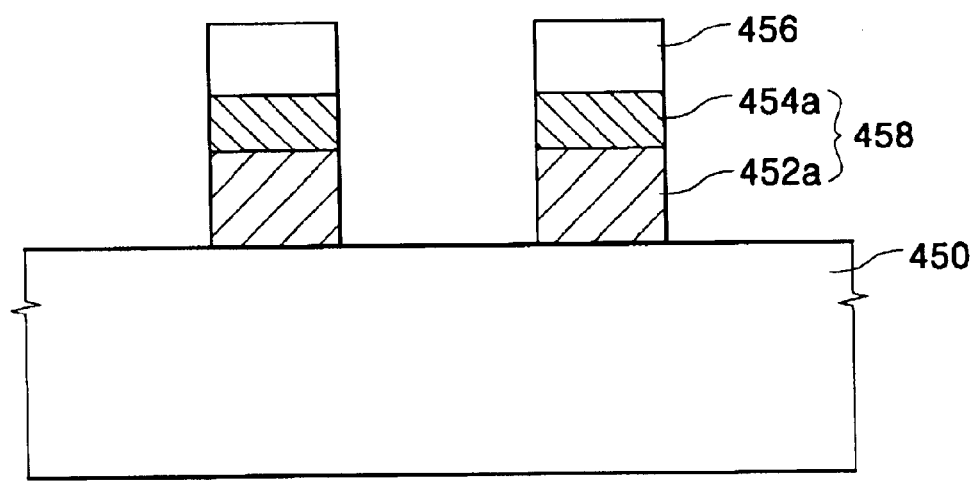

Referring to FIG. 8B, a photoresist pattern 456 is formed on the silicon nitride film 454 for selectively masking the silicon nitride film 454 and the tungsten film 452 in order to form a conductive film pattern. Then, the silicon nitride film 454 and the tungsten film 452 are successively etched using the photoresist pattern 456 as an etching mask, thereby forming a structure 458 including a tungsten film pattern 452a and a silicon nitride film pattern 454a.

Figure 8C:
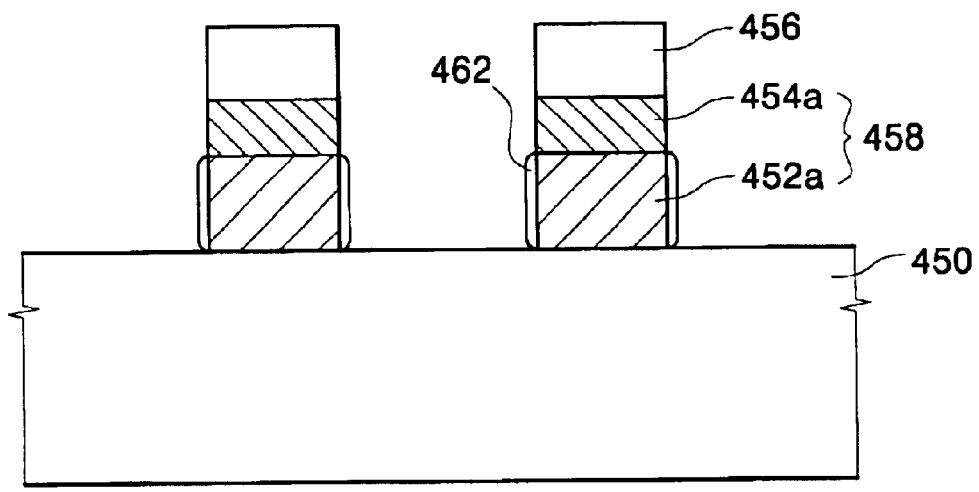

Referring to FIG. 8C, the structure 458 on which the photoresist pattern 456 is positioned is nitrified, thereby forming a tungsten nitride film 462 having a predetermined depth from a side portion of the tungsten film pattern 452a. A RTN process or a plasma process using a gas containing a nitrogen compound may be used to form the tungsten nitride film 462.

Figure 8D:
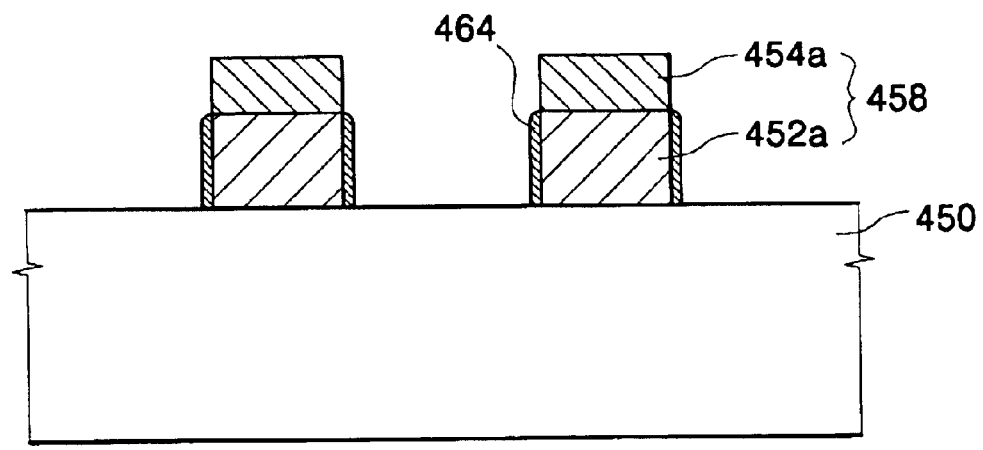

Referring to FIG. 8D, the photoresist pattern 456 on the structure 458 is removed using a gas including oxygen. At the same time, the tungsten nitride film 462 formed at the side portion of the tungsten film pattern 452a is reacted with the oxygen so that a tungsten oxy-nitride film 464 is formed at the side portion of the tungsten film pattern 452a. A plasma ashing process using oxygen ($O_2$) or ozone ($O_3$) may be performed to remove the photoresist pattern 456 and to form the tungsten oxy-nitride film 464.

Figure 8E:
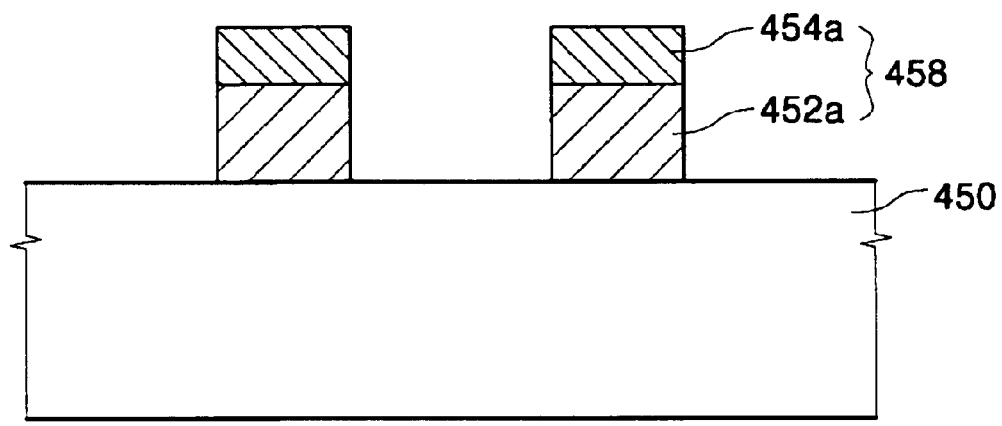

Referring to FIG. 8E, the tungsten oxy-nitride film 464 (FIG. 8D) having the predetermined depth from the surface of the tungsten film pattern 452a is removed using an etching solution that is capable of etching silicon oxide. When such an etching solution is used for etching the tungsten oxy-nitride film 464, undesired films formed on the tungsten film pattern 452a can be easily removed without etching the tungsten film pattern 452a.

Figure 8F:
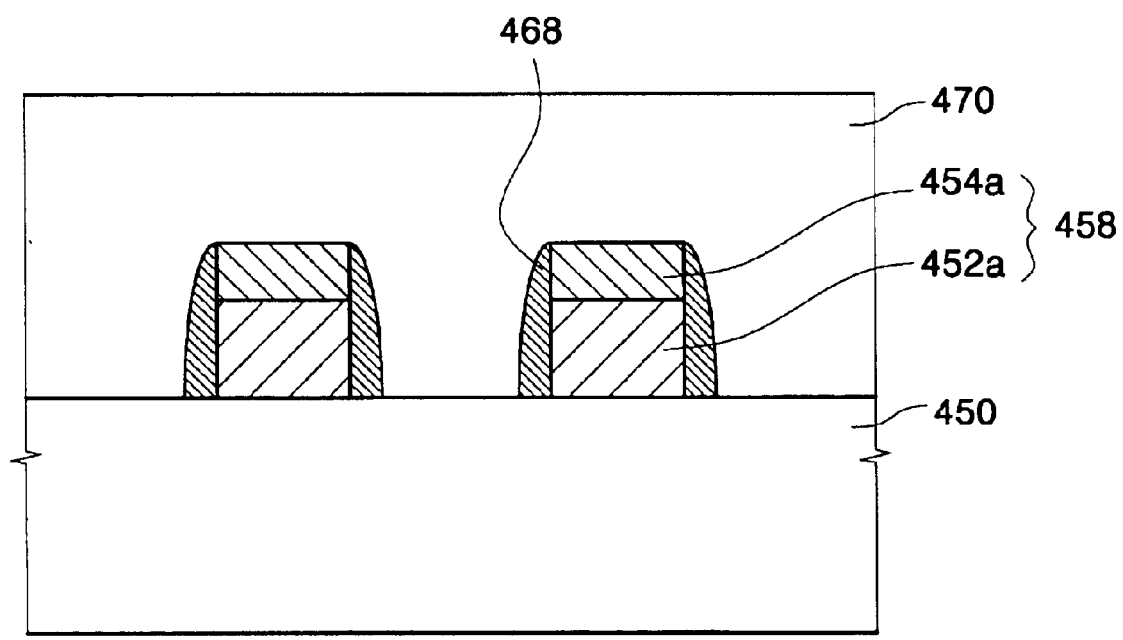

Referring FIG. 8F, nitride spacers 468 are formed on side portions of the structure 458 including the tungsten film pattern 452a formed in accordance with the above-described processes. Then, an interlayer dielectric 470 is formed to completely cover the structure 458 including nitride spacers 468. The nitride spacers 468 and the nitride film pattern 454a function as a passivation film for the tungsten film pattern 452a in order to prevent an oxidation of the tungsten film pattern 452a when the interlayer dielectric 470 is formed.

In a conventional method of forming a conductive film or conductive pattern on a semiconductor device, when an undesired tungsten oxide film is formed on a surface of a tungsten film pattern after the tungsten film pattern is formed and a series of successive processes are performed, the tungsten oxide film can be hardly removed using an etching solution or an etching gas because the tungsten oxide has very stable chemical bonds. As a result, the tungsten oxide film on the tungsten film pattern grows abnormally during a subsequent thermal process so that a bridge failure between tungsten patterns adjacent to each other may occur.

However, according to the present invention, the tungsten film pattern is treated with the above-described processes to remove the undesired films formed on the tungsten film pattern, thereby preventing the bridge failure generated between adjacent tungsten film patterns during successive processes.

Comparative Experiment

Figure 9:
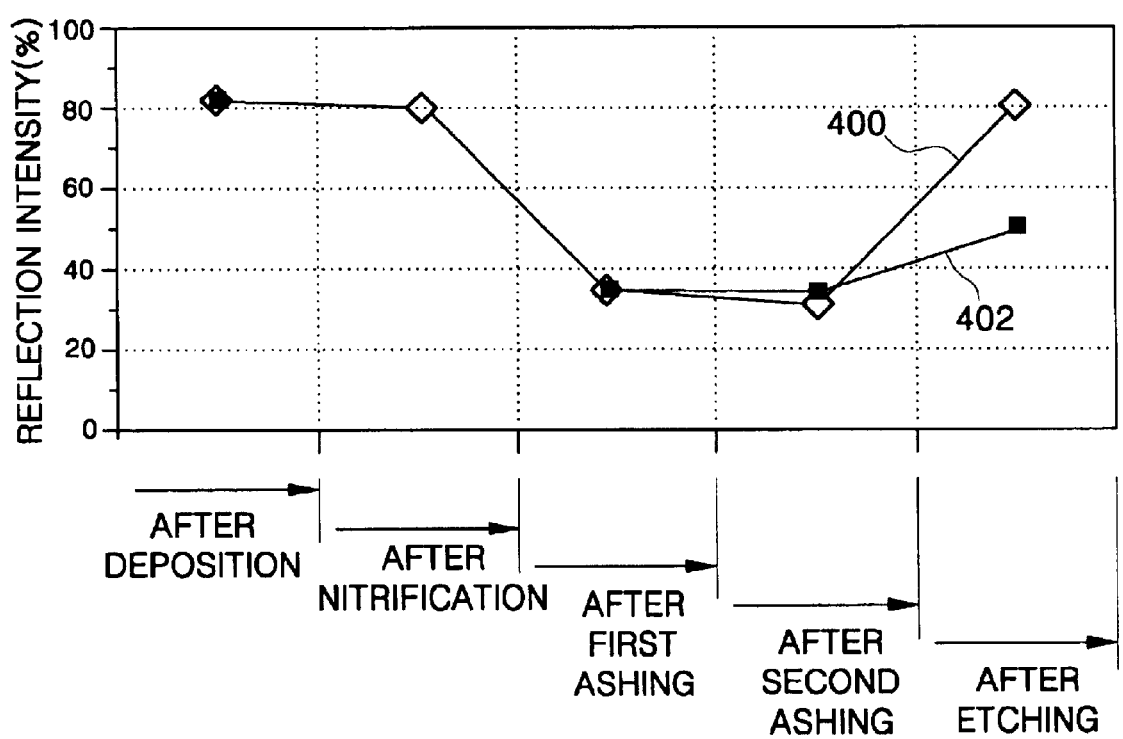
FIG. 9 is a graph showing reflection intensities of tungsten films formed according to the conventional method and a method of the present invention, respectively.

FIG. 9 is a graph showing reflection intensities of a tungsten film formed by the method of the present invention in comparison with reflection intensities of a tungsten film made by a conventional method.

In FIG. 9, the reflection intensities of the tungsten films indirectly indicate whether or not undesired films are formed on the tungsten films. That is, the reflection intensities decrease when oxide or nitride films are present on the tungsten films. A graph 400 denotes reflection intensities of the tungsten film formed by the method of the present invention at each process of the present invention, and a graph 402 denotes reflection intensities of the tungsten film formed by a conventional method at each process of the conventional method.

Referring to FIG. 9, as illustrated by graphs 400 and 402, reflection intensities of both tungsten films are about 80% at surfaces of the tungsten films after initial deposition of the tungsten films.

As illustrated in graph 400, after nitrification by a plasma process using $NH_3$ gas as a reaction gas was performed on the deposited tungsten film of the present invention, the reflection intensity measured on the surface of the tungsten film of the present invention was approximately identical to that of the initially deposited tungsten films.

Next, reflection intensities for both tungsten films are shown after performance of an ashing process on the tungsten films using oxygen plasma. Graph 400 illustrates the tungsten film formed by the present invention, which underwent the nitrification process by the plasma process with the $NH_3$ gas prior to undergoing the ashing process. The reflection intensity of the tungsten film in graph 400 after the ashing process was about 30%. Graph 402 shows the conventionally formed tungsten film, which did not undergo the nitrification process of the present invention prior to undergoing the ashing process. That is, the third slice of graph 402 shows the reflection intensity of the conventionally formed tungsten film after undergoing the ashing process using oxygen plasma without having undergone the nitrification process by a plasma process using $NH_3$ gas. The reflection intensity of the conventionally formed tungsten film after the ashing process was also about 30%. Thus, it is indirectly shown that residues generated by the reaction of oxygen and tungsten were formed on the tungsten films during the ashing process, thereby decreasing the reflection intensities of the tungsten films. In addition, as illustrated in section 4 of graphs 400 and 402, repeated performance of the ashing process did not cause the reflection intensities of the tungsten films to increase.

Next, reflection intensities of the tungsten films were measured after etching the tungsten films. To etch the tungsten films, after having undergone the ashing process, the tungsten films were treated with a hydrofluoric acid solution for about 150 seconds and rinsed. As shown in the final section of graph 402, the reflection intensity of the conventionally formed tungsten film, which did not undergo the plasma process with $NH_3$ gas as the reaction gas, was only about 50% after the tungsten film was treated with the hydrofluoric acid solution. However, in the case of the tungsten film formed by the present invention, which underwent the plasma process with the $NH_3$ gas as the reaction gas, the reflection intensity of the tungsten film increased to about 80% after the tungsten film was treated with the hydrofluoric acid solution, as illustrated in the final section of graph 400. Hence, reacted residues formed on the surface of the tungsten film that was formed by the present invention were completely removed by the treatment with the hydrofluoric acid solution, whereas the residues were only partially removed from the conventionally formed tungsten film.

Therefore, as previously stated, nitrification of the tungsten film by a plasma process using a nitrogen containing gas as the reaction gas allowed the residues to be completely removed by etching, whereas when the nitrification process by a plasma process using a nitrogen containing gas as the reaction gas was omitted, the residues could not be completely removed by etching.

As it is described above, according to the present invention, a surface of a tungsten film or a tungsten film pattern is chemically treated to change oxides formed on the surface of the tungsten film or the tungsten film pattern into a material easily etched with an etching solution, thereby removing oxides formed on the tungsten film or the tungsten film pattern. Therefore, a resistance of the tungsten film or the tungsten film pattern may be reduced, and the generation of failures due to reacted residues formed on the tungsten film or the tungsten film pattern may be prevented.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a conductive film of a semiconductor device comprising:
   i) nitrifying a semiconductor substrate on which a tungsten film having a partially oxidized surface is formed, to form a tungsten nitride film on the surface of the tungsten film;
   ii) oxidizing the surface of the tungsten film having the tungsten nitride film to change the tungsten nitride film into a tungsten oxy-nitride film; and
   iii) removing the tungsten oxy-nitride film and any residue generated by a reaction of tungsten from the surface of the tungsten film, to form a tungsten film.

2. The method for forming a conductive film of a semiconductor device as claimed in claim 1, wherein (i) is performed through a rapid thermal nitrification method or a plasma process using a gas including a nitrogen compound.

3. The method for forming a conductive film of a semiconductor device as claimed in claim 2, wherein the plasma process is performed at an energy of approximately 200 to 1000 W using at least one reaction gas selected from the group consisting of $NH_3$ gas, NF gas and $N_2$ gas.

4. The method for forming a conductive film of a semiconductor device as claimed in claim 1, wherein (ii) is performed through a rapid thermal oxidization process or a plasma process using an oxygen gas.

5. The method for forming a conductive film of a semiconductor device as claimed in claim 1, wherein the tungsten oxy-nitride film is removed using an etching solution for etching oxide in (iii).

6. The method for forming a conductive film of a semiconductor device as claimed in claim 5, wherein the etching solution comprises hydrofluoric acid or a mixture of hydrofluoric acid and hydrogen peroxide.

7. A method for forming a conductive pattern of a semiconductor device comprising:
   i) forming a conductive film mainly composed of tungsten on a semiconductor substrate;
   ii) forming a photo resist pattern on the conductive film;
   iii) forming a conductive pattern by etching the conductive film using the photo resist pattern as an etching mask;
   iv) removing the photo resist pattern while a surface of the conductive pattern is partially oxidized;
   v) nitrifying the conductive pattern including the partially oxidized surface to change the tungsten in the surface of the conductive pattern into a tungsten nitride film;
   vi) oxidizing the conductive pattern including the tungsten nitride film formed thereon to change the tungsten nitride film formed on the surface of the conductive pattern into a tungsten oxy-nitride film; and vii) forming a conductive pattern without an oxide on the conductive pattern by removing the tungsten oxy-nitride film.

8. The method for forming a conductive pattern of a semiconductor device as claimed in claim 7, wherein the conductive film comprises a tungsten film and a tungsten silicide film.

9. The method for forming a conductive pattern of a semiconductor device as claimed in claim 7, wherein (v) is performed by a rapid thermal nitrification process or a plasma process using a gas including a nitrogen compound.

10. The method for forming a conductive pattern of a semiconductor device as claimed in claim 9, wherein the plasma process is performed at an energy of approximately 200 to 1000 W using at least one reaction gas selected from the group consisting of $NH_3$ gas, NF gas and $N_2$ gas.

11. The method for forming a conductive pattern of a semiconductor device as claimed in claim 7, wherein (vi) is performed by a rapid thermal oxidization process or a plasma process using an oxygen gas.

12. The method for forming a conductive pattern of a semiconductor device as claimed in claim 7, wherein the tungsten oxy-nitride film is removed using an etching solution for etching oxide in (vii).

13. The method for forming a conductive pattern of a semiconductor device as claimed in claim 12, wherein the etching solution comprises hydrofluoric acid or a mixture of hydrofluoric acid and hydrogen peroxide.

14. The method for forming a conductive pattern of a semiconductor device as claimed in claim 7, wherein (i) further comprises forming a silicon nitride film on the conductive film.

15. The method for forming a conductive pattern of a semiconductor device as claimed in claim 7, further comprising forming a nitride spacer at a side portion of the conductive pattern after (vii).

16. A method for forming a conductive pattern of a semiconductor device comprising:

i) forming a conductive film mainly composed of tungsten on a semiconductor substrate;

ii) forming a photoresist pattern on the conductive film;

iii) forming a conductive pattern on which the photoresist pattern is formed by etching the conductive film using the photoresist pattern as an etching mask;

iv) nitrifying the conductive pattern to change the tungsten in a side portion of the conductive pattern into a tungsten nitride film;

v) removing the photoresist pattern using a gas including oxygen, and simultaneously changing the tungsten nitride film into a tungsten oxy-nitride film; and vi) forming a conductive pattern without an oxide on the conductive pattern by removing the tungsten oxy-nitride film.

17. The method for forming a conductive pattern of a semiconductor device as claimed in claim 16, wherein the conductive film comprises a tungsten film and a tungsten silicide film.

18. The method for forming a conductive pattern of a semiconductor device as claimed in claim 16, wherein (iv) is performed by a rapid thermal nitrification process or a plasma process using a gas including a nitrogen compound.

19. The method for forming a conductive pattern of a semiconductor device as claimed in claim 18, wherein the plasma process is performed at an energy of approximately 200 to 1000 W using at least one reaction gas selected from the group consisting of $NH_3$ gas, NF gas and $N_2$ gas.

20. The method for forming a conductive pattern of a semiconductor device as claimed in claim 16, wherein (v) is performed by a plasma process using an oxygen gas.

21. The method for forming a conductive pattern of a semiconductor device as claimed in claim 16, wherein the tungsten oxy-nitride film is removed using an etching solution for etching oxide in (vi).

22. The method for forming a conductive pattern of a semiconductor device as claimed in claim 21, wherein the etching solution comprises hydrofluoric acid or a mixture of hydrofluoric acid and hydrogen peroxide.

23. The method for forming a conductive pattern of a semiconductor device as claimed in claim 16, the step (i) further comprising forming a silicon nitride film on the conductive film.

24. The method for forming a conductive pattern of a semiconductor device as claimed in claim 16, further comprising forming a nitride spacer at a side portion of the conductive pattern after (vi).

* * * * *